United States Patent [19]
Marshall et al.

[11] Patent Number: 5,898,211
[45] Date of Patent: Apr. 27, 1999

[54] LASER DIODE PACKAGE WITH HEAT SINK

[75] Inventors: Dana A. Marshall, Frontenac; Herbert G. Koenig, St. Charles, both of Mo.

[73] Assignee: Cutting Edge Optronics, Inc., St. Charles, Mo.

[21] Appl. No.: 08/641,235

[22] Filed: Apr. 30, 1996

[51] Int. Cl.[6] ............ H01L 29/93; H01L 29/06; H01L 23/10; H01L 23/34
[52] U.S. Cl. ............ 257/601; 257/625; 257/706; 257/713; 257/910
[58] Field of Search .................... 257/601, 625, 257/706, 713, 910

[56] References Cited

U.S. PATENT DOCUMENTS

| | | |
|---|---|---|
| 3,339,151 | 8/1967 | Smith . |
| 3,590,248 | 6/1971 | Chatterton, Jr. . |
| 3,771,031 | 11/1973 | Kay . |
| 3,962,655 | 6/1976 | Selway et al. . |
| 4,092,614 | 5/1978 | Sakuma et al. ............ 331/94.5 |
| 4,315,225 | 2/1982 | Allen, Jr. et al. . |
| 4,383,270 | 5/1983 | Schelhorn ............ 357/71 |
| 4,393,393 | 7/1983 | Allen, Jr. et al. . |
| 4,454,602 | 6/1984 | Smith . |
| 4,573,067 | 2/1986 | Tuckerman et al. ............ 357/82 |
| 4,617,585 | 10/1986 | Yasui ............ 357/72 |
| 4,716,568 | 12/1987 | Scifres et al. . |
| 4,730,324 | 3/1988 | Azad . |
| 4,831,629 | 5/1989 | Paoli et al. . |
| 4,847,848 | 7/1989 | Inoue et al. . |
| 4,877,641 | 10/1989 | Dory ............ 427/38 |
| 4,881,237 | 11/1989 | Donnelly ............ 372/50 |
| 4,899,204 | 2/1990 | Rosen et al. ............ 357/30 |

(List continued on next page.)

FOREIGN PATENT DOCUMENTS

| | | | |
|---|---|---|---|
| 0 458 469 A1 | 11/1991 | European Pat. Off. ............ 257/675 |
| 0 550 996 A1 | 1/1992 | European Pat. Off. . |
| 0 634 822 A1 | 1/1995 | European Pat. Off. . |

OTHER PUBLICATIONS

Endriz et al., "High Power Diode Laser Arrays," IEEE J. Quantum Electronics 28 (1992) Apr., No. 4, pp. 952–965.
IBM Tech. Dis. Bull. 31(12), May 1989, pp. 5–7.
IBM Tech. Dis. Bull. 31(6), Nov. 1988, pp. 372–373.
Thomson–CSF Semiconducteurs Specifiques, Package Specification (schematic), p. 3 (one page) Date Not Available.
Coherent Laser Group, Laser Diodes and Bars (article) (5 pages) Date Not Available.

*Primary Examiner*—David Graybill
*Attorney, Agent, or Firm*—Arnold White & Durkee

[57] ABSTRACT

A laser diode package includes a laser diode, a heat sink and a lid. The laser diode has an emitting surface, a reflective surface opposing the emitting surface, and first and second surfaces between the emitting surface and the reflective surface. The laser diode has a diode height defined between the emitting surface and the reflective surface. The heat sink has an interior surface, an exterior surface opposing the interior surface, a top surface and a base surface. The height of the heat sink is defined between the top surface and the base surface and is approximately less than four times the laser diode height. The first surface of the diode is attached to the interior surface of the heat sink with a first solder. The base surface of the heat sink is coupled to a thermal reservoir. The lid is attached to the second surface of the laser diode via a second solder. An upper end of the lid is near the emitting surface of the laser diode. A lower end of the lid is typically slightly below the reflecting surface of the laser diode. A plurality of laser diode packages are grouped together to form an array. The heat sink of each of the laser diode packages is attached to a backplane which is then connected to a thermal reservoir.

49 Claims, 4 Drawing Sheets

U.S. PATENT DOCUMENTS

| | | | |
|---|---|---|---|
| 4,901,330 | 2/1990 | Wolfram et al. . | |
| 4,949,346 | 8/1990 | Kuper et al. . | |
| 4,975,923 | 12/1990 | Buus et al. | 372/50 |
| 5,022,042 | 6/1991 | Bradley . | |
| 5,031,187 | 7/1991 | Orenstein et al. | 372/50 |
| 5,040,187 | 8/1991 | Karpinski . | |
| 5,073,838 | 12/1991 | Ames | 361/103 |
| 5,084,888 | 1/1992 | Tajima et al. . | |
| 5,099,214 | 3/1992 | Rosen et al. . | |
| 5,099,488 | 3/1992 | Ahrabi et al. | 372/361 |
| 5,105,429 | 4/1992 | Mundinger et al. | 372/34 |
| 5,115,445 | 5/1992 | Mooradian . | |
| 5,128,951 | 7/1992 | Karpinski . | |
| 5,156,999 | 10/1992 | Lee | 437/215 |
| 5,163,064 | 11/1992 | Kim et al. | 372/50 |
| 5,212,699 | 5/1993 | Masuko et al. | 372/34 |
| 5,216,263 | 6/1993 | Paoli | 257/88 |
| 5,216,688 | 6/1993 | Kortz et al. | 372/75 |
| 5,284,790 | 2/1994 | Karpinski . | |
| 5,287,375 | 2/1994 | Fujimoto | 372/38 |
| 5,305,344 | 4/1994 | Patel . | |
| 5,311,535 | 5/1994 | Karpinski . | |
| 5,323,411 | 6/1994 | Shirasaka et al. | 372/43 |
| 5,325,384 | 6/1994 | Herb et al. . | |
| 5,337,325 | 8/1994 | Hwang | 372/36 |
| 5,351,259 | 9/1994 | Ishimori et al. . | |
| 5,388,755 | 2/1995 | Baxter . | |
| 5,394,426 | 2/1995 | Joslin . | |
| 5,394,427 | 2/1995 | McMinn et al. | 372/70 |
| 5,402,436 | 3/1995 | Paoli . | |
| 5,402,437 | 3/1995 | Mooradian . | |
| 5,438,580 | 8/1995 | Patel et al. . | |
| 5,485,482 | 1/1996 | Selker et al. . | |
| 5,526,373 | 6/1996 | Karpinski . | |
| 5,663,979 | 9/1997 | Marshall | 372/103 |

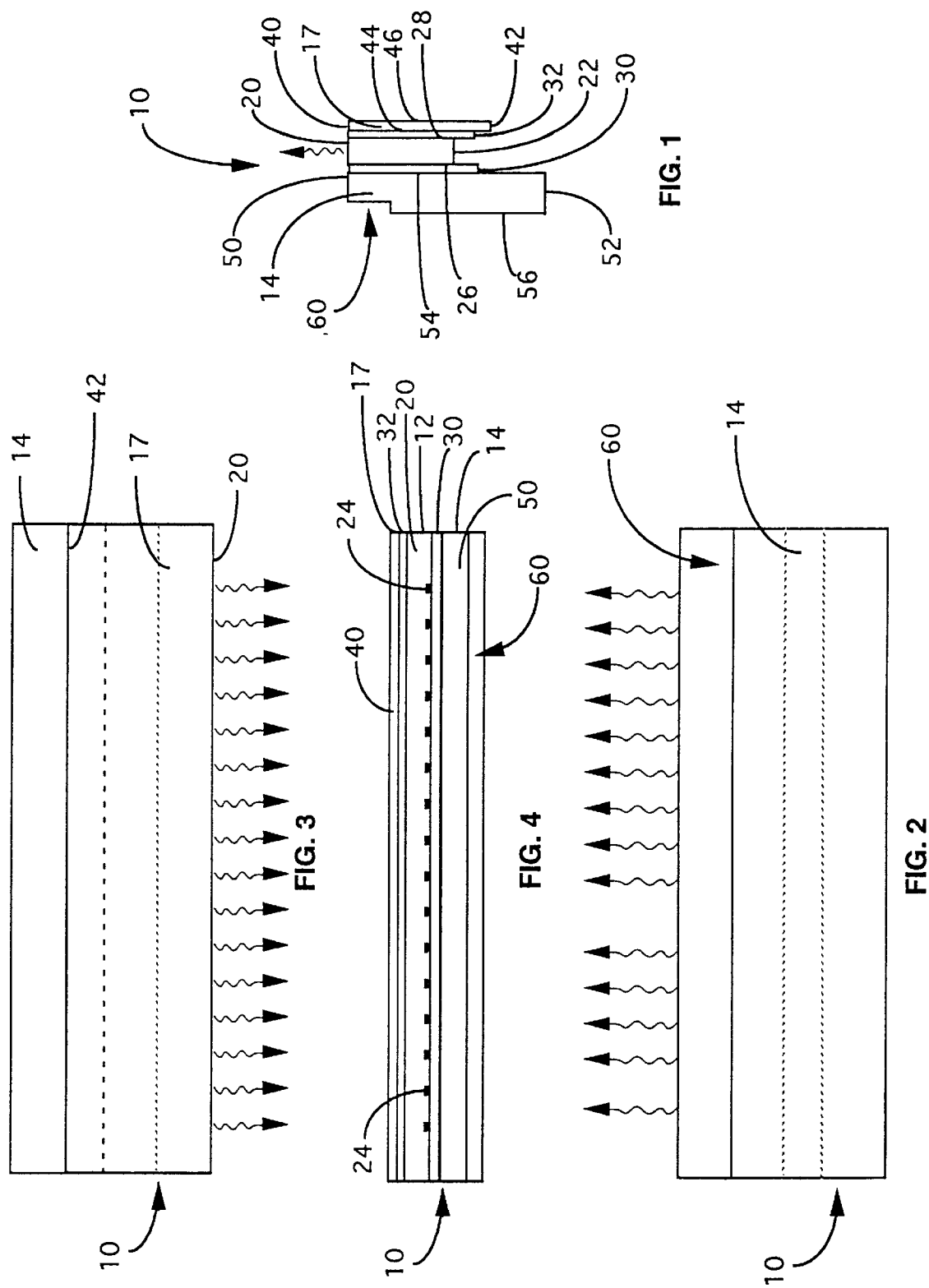

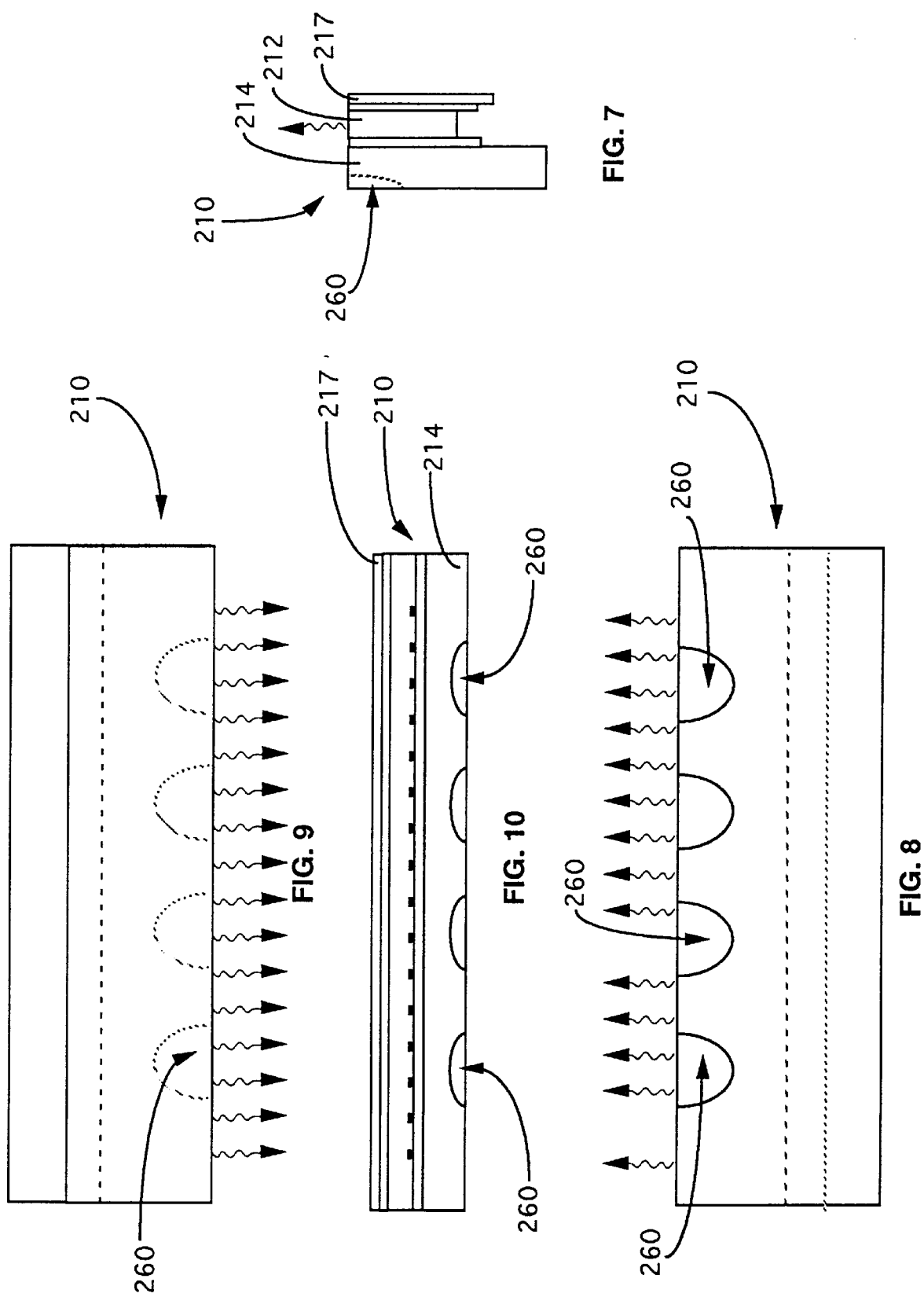

LASER DIODE PACKAGE WITH HEAT SINK

FIELD OF THE INVENTION

The present invention relates generally to lasers diodes and, in particular, to a package for a laser diode that reduces the thermal resistance between the junction of the laser diode and the ultimate thermal reservoir.

BACKGROUND OF THE INVENTION

Semiconductor laser diodes have numerous advantages. They are small in that the widths of their active regions are typically submicron to a few microns and their heights are usually no more than a fraction of a millimeter. The length of their active regions is typically less than about a millimeter. The internal reflective surfaces, which are required in order to produce emission in one direction, are formed by cleaving the substrate from which the laser diodes are produced and, thus, have high mechanical stability.

High efficiencies are possible with semiconductor laser diodes with pulsed junction laser diodes having external quantum efficiencies near 50% in some cases. Semiconductor lasers produce radiation at wavelengths from about 20 to about 0.7 microns depending on the choice of semiconductor alloy. For example, laser diodes made of gallium arsenide with aluminum doping (AlGaAs) emit radiation at approximately 0.8 microns (~800 mn) which is near the absorption spectrum of common solid state laser rods and slabs made from Neodymium doped, Yttrium-Aluminum Garnet (Nd:YAG), and other crystals and glasses. Thus, semiconductor laser diodes can be used as the optical pumping source for larger, solid state laser systems.

Universal utilization of semiconductor laser diodes has been restricted by thermally related problems. These problems are associated with the large heat dissipation per unit area of the laser diodes which results in elevated junction temperatures and stresses induced by thermal cycling. Laser diode efficiency and the service life of the laser diode is decreased by increases in junction temperature.

Furthermore, the emitted wavelength of a laser diode is a function of its junction temperature. Thus, when a set output wavelength is desired, maintaining a constant junction temperature is essential. For example, AlGaAs laser diodes used to pump a Nd:YAG rod or slab should emit radiation at 808 nm since this is the wavelength at which optimum absorption exists in the Nd:YAG. But, for every 3.5° C. to 4.0° C. deviation in the junction temperature of the AlGaAs laser diode, the wavelength shifts 1 nm. Thus, controlling the junction temperature and, thus, properly dissipating the heat is critical.

When solid state laser rods or slabs are pumped by emissions from laser diodes, dissipation of the heat becomes more problematic. Since each individual diode is quite small, it becomes necessary to closely pack a plurality of individual diodes into arrays in order to generate the required amounts of input power to the larger, solid state laser rod or slab. However, when the packing density of the individual laser diodes is increased, the space available for extraction of heat from the individual laser diodes necessarily decreases. This aggravates the problem of heat extraction from the arrays of individual diodes.

One known package which attempts to resolve these thermally-related problems includes the use of a thin, thermally conductive ceramic structure, like beryllium oxide, which is bonded to a thermal reservoir. The ceramic structure includes straight grooves cut therein in which the individual laser diodes are placed. A metallized layer extends from groove to groove to conduct electricity therethrough and supply electrical power to each of the plurality of laser diodes. The laser diodes are soldered in the grooves to the metallized layer.

However, this known package has several problems. For example, laser diodes typically have a slight curvature due to the process by which they are made. Placing a curved laser diode in the straight groove of this known package results in additional stress on the laser diode and an uneven solder bond along the length of the laser diode which can lead to failure. Also, the bottom side of the laser diode in the groove, which is the reflective surface, cannot be cleaned after it is installed which may lead to failures. Additionally, most ceramics, even beryllium oxide, have a lower thermal conductivity than conductive metals such as copper or silver. If beryllium oxide is used, further problems arise since it is a toxic material and cutting grooves produces airborne dust particles. Lastly, because it is extremely difficult to test a laser diode by itself (i.e. not in a package), soldering an untested laser diode into a groove results in an array which may have laser diodes that do not provide optimal performance. Extra cost is then incurred for the removal of a poor performing laser diode.

Therefore, a need exists for a highly conductive laser diode package that is easy to assemble, provides structural support to the laser diode during handling and transportation, allows for cleaning of the reflective surface of the laser diode after assembly, provides for testing of individual laser diodes before their assembly into an array, and is produced from non-toxic, inexpensive materials.

SUMMARY OF TBE INVENTION

A laser diode package includes a laser diode, a heat sink and a lid. The laser diode has an emitting surface, a reflective surface opposing the emitting surface, and first and second side surfaces between the emitting surface and the reflective surface. The laser diode has a diode height defined between the emitting surface and the reflective surface.

The heat sink has an interior surface, an exterior surface opposing the interior surface, a top surface and a base surface. The height of the heat sink is defined between the top surface and the base surface and is less than approximately four times the laser diode height. The first surface of the diode is attached to the interior surface of the heat sink with a first solder layer. The base surface of the heat sink is coupled to a thermal reservoir.

The lid is attached to the second surface of the laser diode via a second solder layer. An upper end of the lid is near the emitting surface of the laser diode. A lower end of the lid is typically slightly below the reflecting surface of the laser diode. A region below the reflective surface between the interior surface of the heat sink and the lid is filled with an inert gas, usually air.

The heat sink and lid are typically made from an electrically conductive material. When electrical power is applied to the laser diode package, electromagnetic radiation if produced at the junction of the laser diode and emitted at the emitting surface. Also, a substantial amount of heat is produced. Because of the minimal height of the heat sink, the laser diode package has a minimal thermal resistance between the junction and the thermal reservoir to which the base surface is coupled. Consequently, the junction temperature is minimized.

Furthermore, the laser diode package of the present invention exposes more of the laser diode, especially at its reflective surface, than known packages which facilitates cleaning after the laser diode has been soldered into the package. Also, the laser diode package provides for structural integrity to the laser diode during handling and transportation. And, the package provides easy testing of the laser diode prior to assembly into an array.

A plurality of laser diode packages are grouped together to form an array. The heat sink of each of the laser diode packages is attached to a backplane which is then connected to a thermal reservoir. The heat sink of each laser diode package may be soldered to an electrically insulative backplane, or attached to an electrically conductive backplane via electrically nonconductive, but thermally conductive materials such as thermal epoxies. Also, the exterior surface of each heat sink is provided with a groove to receive solder to join that heat sink with an adjacent lid.

The above summary of the present invention is not intended to represent each embodiment, or every aspect, of the present invention. This is the purpose of the figures and the detailed description which follow.

BRIEF DESCRIPTION OF THE DRAWINGS

Other objects and advantages of the invention will become apparent upon reading the following detailed description and upon reference to the drawings in which:

FIG. 1 is an end view of the laser diode package of the claimed invention;

FIG. 2 is a first side view of the laser diode package;

FIG. 3 is a second side view of the laser diode package;

FIG. 4 is a top view of the laser diode package;

FIG. 7 is an end view of an alternative laser diode package of the claimed invention;

FIG. 8 is a first side view of the alternative laser diode package of FIG. 7;

FIG. 9 is a second side view of the alternative laser diode package of FIG. 7; and FIG. 10 is a top view of the alternative laser diode package of FIG. 7;

Figure 5:
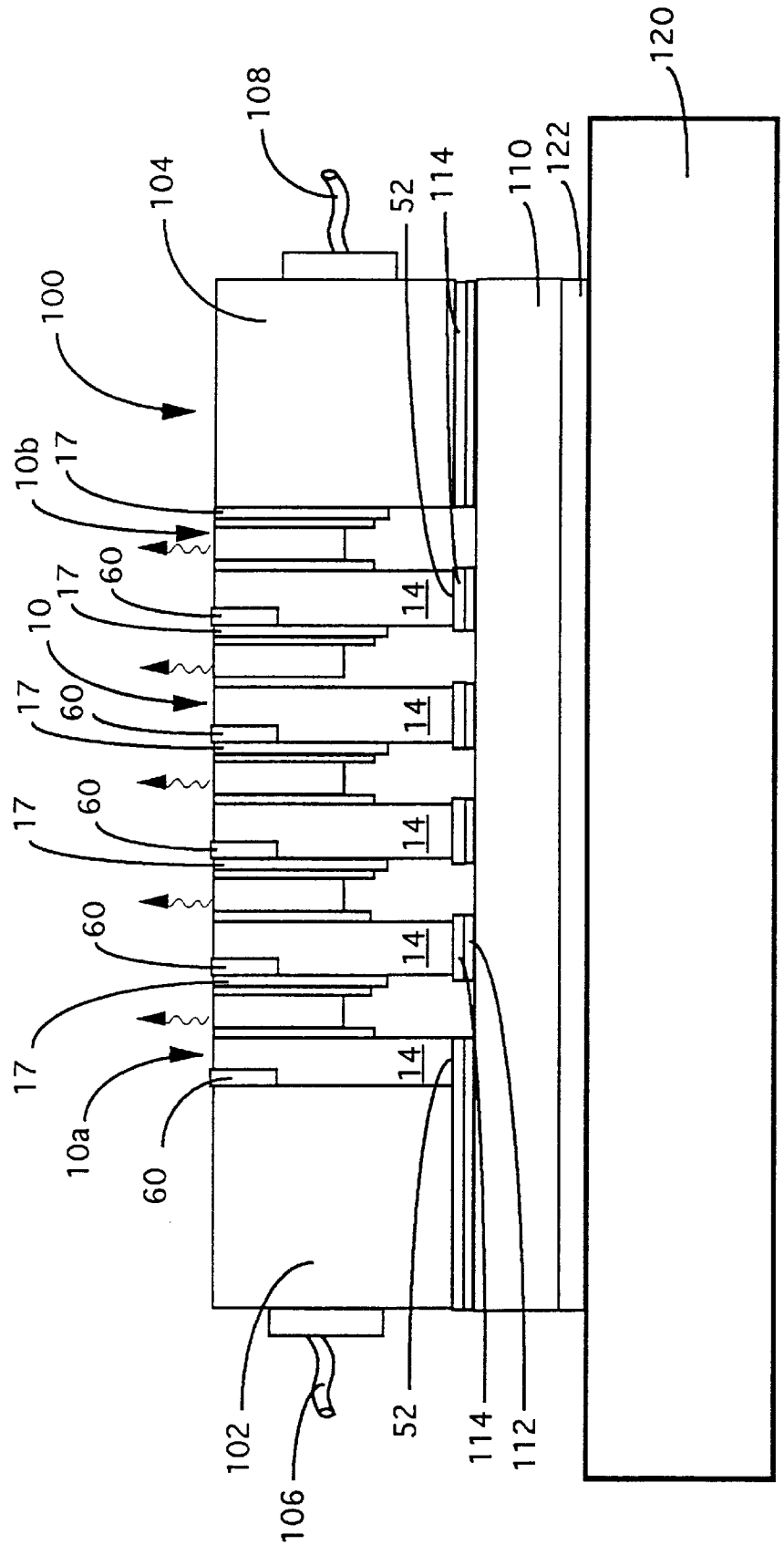
FIG. 5 is an end view of a laser diode array incorporating a plurality of laser diode packages.

While the invention is susceptible to various modifications and alternative forms, a specific embodiment thereof has been shown by way of example in the drawings and will herein be described in detail. It should be understood, however, that it is not intended to limit the invention to the particular forms disclosed the contrary. The intention is to cover all modifications, equivalents, and alternatives falling within the spirit and scope of the invention as defined by the appended claims.

DETAILED DESCRIPTION OF THE INVENTION

Referring initially to FIGS. 1–4, a laser diode package 10 is illustrated in an end view. The laser diode package 10 includes a laser diode 12, a heat sink 14, and a lid 17. The laser diode 12 is illustrated as emitting photons which are depicted as arrows. As illustrated best in FIG. 1, the laser diode 12 is "sandwiched" between the heat sink 14 and the lid 17.

The laser diode 12 includes an emitting surface 20 from which the photons are emitted and a reflective surface 22 positioned opposite the emitting surface 20. The height of the laser diode 12 is defined as the distance between the emitting surface 20 and the reflecting surface 22. The junction of the laser diode 12 where the photons are produced is nearest the heat sink 14 in the laser diode package 10. Electrical power is guided to defined regions of the junction by providing electrically conductive material in the laser diode 12 adjacent those regions and less electrically conductive material outside those regions. Consequently, the laser diode 12 has a plurality of emission points 24 (FIG. 4) on the emitting surface 22 corresponding to those regions where electrical energy is converted into light energy. When the electrical power is applied, photons propagate though the junction and are reflected off the reflecting surface 22 such that emission only occurs at the emitting surface 20.

The laser diode 12 further includes a first surface 26 and a second surface 28 to which the heat sink 14 and the lid 17 are soldered. A first solder layer 30 attaches the first surface 26 of the laser diode 12 to the heat sink 14. A second solder layer 32 attaches the second surface 28 of the laser diode 12 to the lid 17. Typically, the solders used in the first and second solder layers 30 and 32 are the same, although they may be different. Common solders used at the first and second solder layers 30 and 32 include various materials having indium including pure indium, indium gallium alloys, indium tin alloys, and indium gallium tin alloys. In a preferred embodiment, pure indium is used and deposited by thermal evaporation techniques. Generally, the thickness of the first and second solder layers 30 and 32 is in the range from about 1 micron to about 5 microns.

The lid 17 has an upper end 40 near the emitting surface 20 of the laser diode 12 and a lower end 42 that at least extends beyond the reflective surface 22 of the laser diode 12. Thus, the height of the lid 17 defined between the upper end 40 and the lower end 42 is at least slightly larger than the height of the laser diode 12. The lid 17 includes an inner surface 44 to which the second solder layer 32 is attached and an outer surface 46 facing outwardly.

The heat sink 14 has a top surface 50 and a base surface 52. The height of the heat sink 14 is defined as the distance between the top surface 50 and the base surface 52. The base surface 52 is the surface to which the laser diode package 10 attaches, directly or indirectly, to a thermal reservoir where the heat produced at the junction of the laser diode 12 is dissipated as described below in reference to FIG. 5. The heat sink 14 further includes an interior surface 54 to which the first solder layer 30 is attached, and an exterior surface 56 opposing the interior surface 54.

The height of the heat sink 14 is typically less than approximately four times the height of the laser diode 12. In one embodiment, the laser diode 12 has a height approximately 0.02 inch (0.5 mm) and the heat sink 14 has a height less than 0.08 inch (2.0 mm). In a preferred embodiment, the height of the heat sink 14 is less than approximately two times the height of the laser diode 12. By providing a reduced height heat sink 14, the thermal resistance between the junction where the heat is produced and the thermal reservoir is minimized. Consequently, the temperature rise at the junction of the laser diode 12 is reduced.

The thickness of the heat sink 14, measured between the interior surface 54 and exterior surface 56, is generally greater than the thickness of the laser diode 12 which is measured between its first and second surfaces 26 and 28. In a preferred embodiment, the heat sink 14 is approximately 0.007 inch (0.18 mm) thick and the laser diode 12 has a thickness of approximately 0.005 inch (0.13 mm). In another preferred embodiment, the thickness of the heat sink 14 is more than about 10% of its height. The thicker the heat sink 14 is, the less thermal resistance the heat sink 14 has because the cross-sectional area through which the heat flows is increased. Increasing the thickness of the heat sink 14, however, reduces the packing density of an array of laser diode packages 10.

Because the purpose of the lid 17 is primarily to provide structural integrity and a low resistance electrical contact to the laser diode 12 and not remove heat, the lid 17 has a lesser thickness than the laser diode 12 and does not need to be coupled to the thermal reservoir. Thus, the lid 17 generally has a height that is slightly longer than the height of the laser diode 12 and a thickness that is generally less than the laser diode 12. In one embodiment, the thickness of the lid 17 is approximately 0.002 inch (0.05 mm) and its height is about 0.025 inch (~0.6 mm).

The laser diode package 10 minimizes the likelihood of electrical shorts between the heat sink 14 and the lid 17 because the lid 17 does not have a significant height and, therefore, a significant area to which arcing may occur. The gap between the heat sink 14 on its interior side 54 below the reflective surface 22 of the laser diode 12 and the lid 17 is filled with inert gas, usually air. If the lid 17 and the heat sink 14 are made of flexible thin foils, there is a chance that the two pieces will bend and contact each other which leads to an electrical short. Thus, the short heights on the lid 17 and the heat sink 14, as have been described thus far, are preferred.

The heights of the lid 17 and the heat sink 14 are also configured to allow the access to the reflective surface 22 of the laser diode 12 for cleaning that surface 22 after assembly. If the lid 17 and the heat sink 14 are made of flexible thin foils, then having a substantial height will likely lead to one or both of the pieces covering the reflective surface 22. Consequently, short heights in the lid 17 and the heat sink 14 are also preferable for this reason as well.

In some applications, the lid 17 may have a height that is approximately the height of the heat sink 14. Thus, the lower end 42 of the lid 17 may be bonded to a thermal reservoir as is the heat sink 14 and remove a portion of the heat produced by the laser diode 12. However, because the junction of the laser diode 12 is near the heat sink 14, the removal of heat through the lid 17 is not as effective as the removal of heat through the heat sink 14.

The length of the heat sink 14 and the lid 17, shown in FIGS. 2–4, is a function of the length of the laser diode 12. Typically, the laser diode 12 has a length of approximately 1 cm, although variations exist which depend on the process by which the laser diode 12 is produced, and also by the application.

The overall thermal resistance between the junction of the laser diode 12 and the thermal reservoir is largely dependent on the thermal conductivity of the material used in the heat sink 14. Moreover, the electrical current must flow from the heat sink 14, through the laser diode 12, and into the lid 17 for the junction of the laser diode 12 to convert electrical energy to radiative energy. Thus, the material of the heat sink 14 generally has a high thermal conductivity and is typically electrically conductive like copper, silver, or gold. Based on the relatively small thickness of the heat sink 14, the material of the heat sink 14 is supplied in the form of foil. It is then cut or etched into the shape of the heat sink 14.

Alternatively, the heat sink 14 may be made of a non-metallic material, such as diamond, boron nitride, aluminum nitride, or beryllium oxide, which have a high thermal conductivity. Such a heat sink 14 would require an electrically conductive metallized layer to provide a path through which the electrical current may flow. The metallized layer would be on the interior surface 54 of the heat sink 14 near the laser diode 12, on the top surface 50, and on at least a portion of the exterior surface 56.

The material of the lid 17 is less critical to the thermal performance of the laser diode package 10 than the material of the heat sink 14. Typically, the lid 17 is made of copper.

To facilitate the joining of adjacent laser diode packages 10, the heat sink 14 may include a groove 60 extending along at least a substantial portion of the length of the heat sink 14 on its exterior surface 56 adjacent the top surface 50. The attachment of adjacent laser diode packages 10 is illustrated in more detail in FIG. 5. The groove 60 typically extends into the heat sink 14 for a distance equal to approximately half of the thickness of the heat sink 14. The height of the grooves 60 is generally less than the height of the laser diode 12. To join adjacent laser diode packages 10, solder is placed within the groove 60 such that the heat sink 14 is made integral with the lid 17 of the adjacent laser diode package 10. Typically, the solder placed into the groove 60 is different than the solder placed in the first and second solder layers 30 and 32 which attach the laser diode 12 to the heat sink 14 and lid 17, respectively. If the same solders were used, then the temperatures required to flow the solder in the groove 60 would likely cause the solder to reflow in the first and second solder layers 30 and 32 near the laser diode 12 such that the laser diode package 10 may become unassembled. Consequently, the solder chosen for the groove 60 has a melting temperature that is less than the melting temperature of the solder chosen in the first and second solder layers 30 and 32.

The laser diode package 10 has several distinct advantages other than the enhanced thermal performance associated with its geometry. Once the laser diode package 10 is assembled, the reflective surface 22 of the laser diode 12 can be accessed for cleaning which is typically accomplished by the use of solvents. Applying the solvents is easy since there are no structures obstructing their direct application to the reflective surface 22 due to the geometrical configuration of the lid 17 and heat sink 14. Cleaning of the reflective surface 22 ensures than no solder or solder flux is present on the reflective surface 22 which may cause radiation to be absorbed and not reflected. Absorbed radiation creates high local temperatures that can lead to a catastrophic failure of the laser diode 12.

The relative flexibility of the lid 17 and heat sink 14 accommodates the inherent curvature that is present in the laser diode 12. This inherent curvature is due to the process by which the laser diode 12 is produced which involves the deposit of several layers of material on a substrate. The layers, which include materials having various coefficients of thermal expansion, are deposited at elevated temperatures. Once the layers have cooled and the substrate is cut, or cleaved, to produce the individual diode bars 12, the mismatch of coefficients of thermal expansion leads to the bending, or bowing, of the individual laser diodes 12. Because the lid 17 and the heat sink 14 are typically less than 0.010 inch thick and made of metal, they are flexible and, in essence, conform to the curvature of the laser diode 12. Not only is the laser diode 12 subjected to less stress because it is not being forced into a straight position as is the case in rigid packages, but the first and second solder layers 30 and 32 can have a constant thickness along the entire length of the laser diode 12. This is important to ensure that the electrical resistance of the laser diode package 10, which is largely a function of the solder material used at the first and second soldering layers 30 and 32, remains constant throughout the length of the laser diode 12. If the electrical resistance is not constant, then the flux of electrical current may be extremely large in the regions of less electrical resistance which can cause an uneven distribution of radiation from the laser diode 12. Furthermore, overheating of regions of the solder layers 30 and 32 and the adjacent regions of the laser diode 12 may occur if voids exist in the solder layers 30 and 32 due to their uneven thicknesses caused by the curvature of the laser diode 12. This ultimately decreases the service life of the laser diode 12 and possibly leads to catastrophic failure.

The laser diode package 10 can also be tested in an easy manner before it is further assembled into an array. Testing is necessary to characterize the laser diode 12 and ensure that each laser diode 12 placed into an array will perform adequately. For example, the threshold current is measured to determine the input current required before radiation is produced. The output power of the laser diode 12 is another parameter which is useful to know before placing the laser diode 12 in an array. The threshold current and the output power are used to determine the efficiency of the laser diode 12. Also, the wavelength emitted from each laser diode 12 is not exactly the same and must be determined.

By laying the package 10 with its heat sink 14 against an electrically and thermally conductive surface of a test station and providing a connector to the lid 17 to close the electrical circuit, these characteristics mentioned above can be tested. Moreover, the thermal capacity of the heat sink 14, determined by the specific heat and the density of the material of the heat sink 14, is enough to allow for low power testing of the laser diode package 10 (i.e. a few watts for a few milliseconds).

Furthermore, when the heat sink 14 and the lid 17 are produced from copper, the overall cost of packaging the laser diode 12 is relatively inexpensive. And, these materials are not hazardous or toxic which minimizes assembly costs since less precautions are necessary.

FIG. 5 illustrates a laser diode array 100 having a plurality of laser diode packages 10 which are arranged in a substantially parallel configuration. The plurality of laser diodes packages 10 includes a first end one 10a and a second end one 10b. First and second end caps 102 and 104, to which first and second electrical lines 106 and 108 are attached, are at either end of the laser diode array 100. The end caps 102 and 104 are made of an electrically conductive material, usually copper. Electrical current conducts from the first electrical line 106, through the first end cap 102, through the plurality of laser diode packages 10, into the second end cap 104, and out the second electrical line 108.

The grooves 60 are filled with a solder which joins the heat sink 14 of one package 10 to a lid 17 of an adjacent package 10. However, the groove 60 of the first end one 10b of the packages 10 is filled with solder to attach that heat sink 14 to the first end cap 102. The solder within the grooves 60 assists in the conduction of electricity between each package 10. The packages 10 can lack these grooves 60 and conduct electricity through the packages 10 if adequate contact pressure exists between the heat sink 14 of one package 10 and the lid 17 of an adjacent package 10.

In an alternative embodiment, the lids 17 may include grooves or notches for receiving solder. This may be in addition to, or independent of, the grooves 60 that have been described thus far.

The heat sink 14 of each of the laser diode packages 10 is bonded to a backplane 110 which is further attached to a thermal reservoir 120 that completes the entire assembly. The backplane 110 is attached to the thermal reservoir 120 by a layer 122 which can be a solder joint or thermally conductive epoxies. The thermal reservoir 120 is typically a heat exchanger having internal fins through which a fluid is circulated. Consequently, the thermal reservoir 120 is typically a conductive metal, such as copper.

The backplane 110 is typically made of an electrically nonconductive material and thermally conductive material such as beryllium oxide, boron nitride, aluminum nitride, or diamond. If the material is electrically nonconductive, the electrical power can not flow therethrough (i.e. short) and bypass the laser diode packages 10. The base surface 52 of each heat sink 14 is soldered to metallized strips 112 on the backplane 110. The solder layer 114 has a thickness that is in the range from about 1 micron to about 0.002 inch and a width that covers at least the thickness of the heat sink 14. The solder layers 114 and metallized strips 112 are also present between each of the end caps 102 and 104, and the backplane 110. However, these end caps 102 and 104 can be bonded to the backplane 110 with other materials as well, such as epoxies.

In an alternative embodiment, the backplane 110 can be electrically and thermally conductive (e.g. copper) as long as adequate protection is made to electrically insulate the heat sinks 14 from the backplane 110. This can be accomplished by vacating any solder bonds between those structures and replacing them with electrically insulative materials like epoxies. Preferably, the epoxy is a thermally conductive epoxy like metal-filled epoxy or diamond-filled epoxy. To further insulate the heat sinks 14 from a metallic backplane 110, the backplane 110 can be coated with a thin dielectric such as silicon oxide prior to the epoxy being applied thereto. A layer of this dielectric with a thickness greater than 0.5 micron provides adequate electrical insulation.

In another embodiment, the backplane 110 is eliminated and the packages 10 are bonded directly to the upper surface of the thermal reservoir 120 which acts as the backplane 120. If the thermal reservoir 120 is metallic, then the electrically insulative measures described in the previous paragraph are incorporated. If the thermal reservoir 120 is electrically non-conductive and made of the materials described above with reference to the electrically non-conductive backplane 110, then the heat sinks 14 can be soldered to the thermal reservoir 120 as they are shown in FIG. 5 soldered to the backplane 110.

Figure 6:
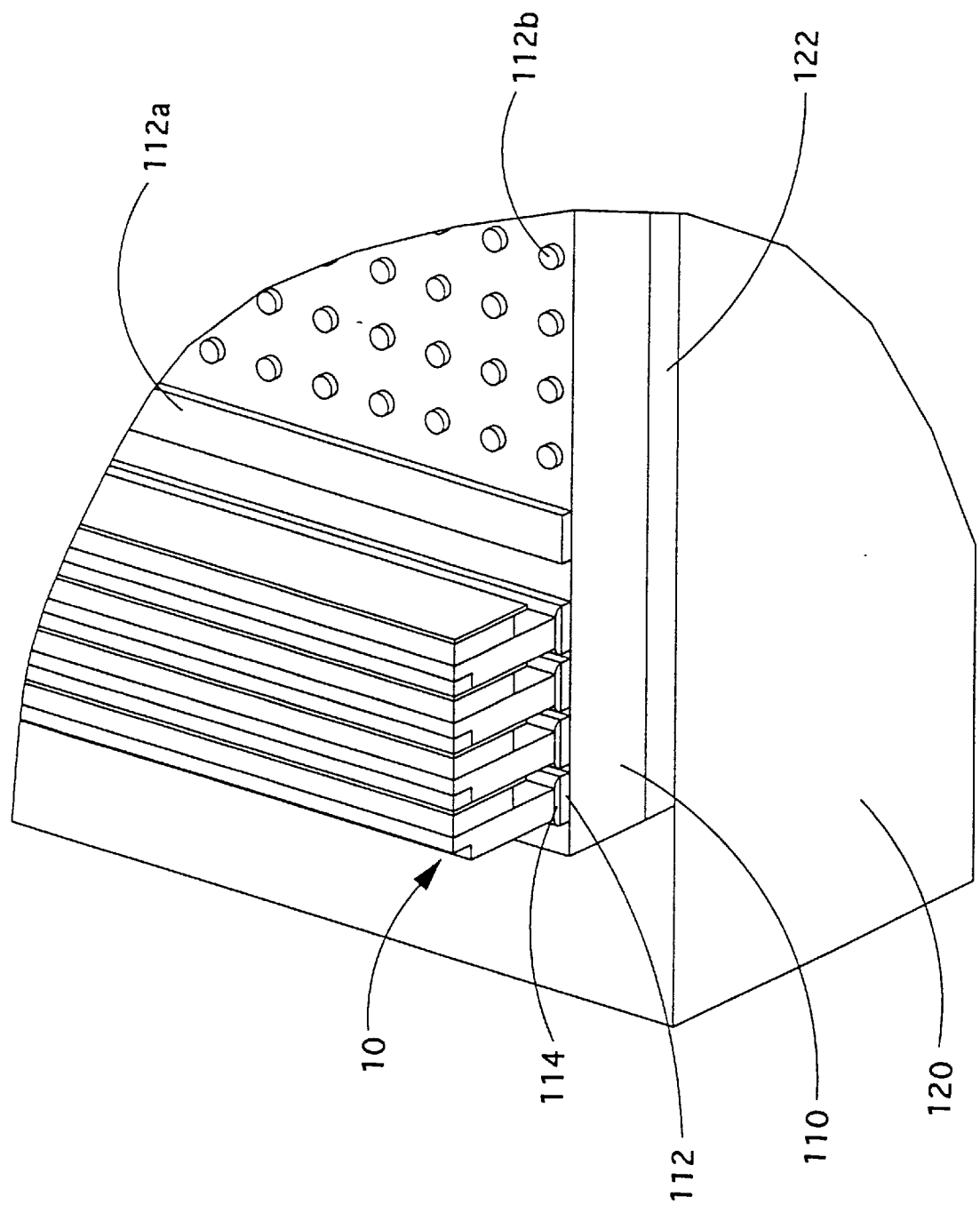
FIG. 6 is an isometric view illustrating the process of assembling the laser diode packages into the laser diode array of FIG. 5.

FIG. 6 illustrates the process by which the laser diode packages 10 are soldered to the backplane 110 on the strips 112. The strips 112 can be one continuous stripe 112a. Alternatively, the strip 112 can be a series of discontinuous pads 112b. The discontinuous pads 112b can be in a variety of shapes including circular (as shown) or rectangular FIGS. 7–10 illustrate a laser diode package 210 that is very similar to the package 10 in FIGS. 1–4. The only difference is the fact that groove 60 in FIGS. 1–4 is now replaced by a series of notches 260. The series of notches 260 serve the same purpose as the groove 60 in that they join (i.e. make integral) a heat sink 214 of one package 210 to a lid 217 of an adjacent package 210. The notches 260 are generally uniformly-spaced along the length of the heat sink 214. The height of the notches 260 is typically less than the height of the laser diode 212. The notches 260 typically extend into the heat sink 214 for a distance equal to approximately half of the thickness of the heat sink 214.

Each of these embodiments and obvious variations thereof is contemplated as falling within the spirit and scope of the invention, which is set forth in the following claims.

What is claimed is:

1. A laser diode package, comprising:
    a laser diode having an emitting surface, a reflective surface opposing said emitting surface, and first and second surfaces between said emitting surface and said reflective surface, said laser diode having a diode height defined between said emitting surface and said reflective surface;
    a heat sink having an interior surface, an exterior surface opposing said interior surface, a top surface and a base surface, said heat sink having a heat sink height defined between said top surface and said base surface, said first surface of said laser diode being attached with a first solder to said interior surface of said heat sink, said base surface for being coupled to a thermal reservoir for dissipating heat from said laser diode, said heat sink height being approximately less than four times said diode height; and
    a lid attached to said second surface of said laser diode through a second solder.

2. The laser diode package of claim 1, wherein said lid has a height, said height being approximately equal to said heat sink height.

3. The laser diode package of claim 2, wherein said lid has a bottom surface, said bottom surface being coupled to said thermal reservoir.

4. The laser diode package of claim 1, wherein said lid height is greater than said diode height and less than said heat sink height.

5. The laser diode package of claim 1, wherein said heat sink is made of a material selected from the group consisting of copper, silver, and gold.

6. The laser diode package of claim 1, wherein said first solder and said second solder are made of the same material.

7. The laser diode package of claim 6, wherein said material includes indium.

8. The laser diode package of claim 1, wherein said heat sink is made of a material selected from the group consisting of diamond, beryllium oxide, aluminum nitride, and boron nitride, said heat sink further including a metallic layer on said top surface and portions of said interior and exterior surfaces.

9. The laser diode package of claim 1, wherein said exterior surface of said heat sink includes a groove extending along a substantial portion of the length of said heat sink said groove being adjacent said top surface of said heat sink.

10. The laser diode package of claim 1, wherein said exterior surface of said heat sink includes a plurality of notches along a substantial portion of the length of said heat sink, each of said plurality of notches being adjacent said top surface of said heat sink.

11. The laser diode package of claim 1, wherein said heat sink height is approximately less than two times said diode height.

12. The laser diode package of claim 1, wherein said laser diode, said heat sink, and said lid each have a length, said lengths of said heat sink and said lid are slightly greater than said length of said laser diode.

13. The laser diode package of claim 1, wherein said heat sink has a thickness, said thickness being greater than approximately 10% of said heat sink height.

14. A laser diode package, comprising:
    a laser diode having an emitting surface and a reflective surface opposing said emitting surface, said laser diode having a diode height defined between said emitting surface and said reflective surface;
    a heat sink having a top surface, a base surface for attachment to a thermal reservoir, and an interior surface to which said laser diode is attached, said heat sink having a heat sink height defined between said top surface and said base surface; and
    a lid attached to said laser diode opposite said heat sink, said lid having an upper end, a lower end, and a height defined between said upper end and said lower end, said upper end being near said emitting surface and said lower end being below said reflecting surface of said laser diode, a region below said reflective surface of said laser diode and between said heat sink and said lid defining a gap, said gap allowing said reflective surface to be exposed for cleaning after assembling of said laser diode package.

15. The laser diode package of claim 14, wherein said lid height is approximately the same as said heat sink height.

16. The laser diode package of claim 14, wherein said lid height and said heat sink height are configured to expose said reflective surface of said laser diode when attached to said laser diode.

17. The laser diode package of claim 16, wherein said heat sink height is less than approximately four times said diode height.

18. The laser diode package of claim 17, wherein said lid height is less than said heat sink height.

19. The laser diode package of claim 14, wherein said lid and said heat sink are attached to said laser diode via solder.

20. A laser diode array, comprising:
    a plurality of laser diode packages, each of said packages including a laser diode, a heat sink, and a lid, said laser diode having an emitting surface, a reflective surface opposing said emitting surface, and a diode height defined between said emitting surface and said reflective surface, said heat sink having a top surface, a base surface, and a heat sink height defined between said top surface and said base surface, said heat sink height being approximately less than four times said diode height, said lid having an upper end near said emitting surface and a lower end below said reflecting surface, said laser diode being disposed between and attached to said heat sink and said lid, and wherein said plurality of laser diode packages are arranged in a parallel configuration with each of said plurality of laser diodes packages being in electrical contact with at least one other of said plurality of laser diode packages, said electrical contact being effectuated by contact between a heat sink of a first one of said plurality of laser diode packages and a lid of an adjacent second one of said plurality of laser diode packages;
    means for supplying electrical power to said plurality of laser diode packages; and
    a backplane to which each of said base surfaces of said heat sinks is attached, said backplane including electrical insulating means to prevent an electrical short between adjacent ones of said plurality of laser diode packages.

21. The laser diode array of claim 20, wherein said electrical supplying means includes first and second end caps and said parallel configuration of said plurality of laser diode packages includes a first end one and a second end one of said plurality of laser diode packages, said first end cap being positioned against a heat sink of said first end one of said plurality of laser diodes packages, said second end cap being positioned against a lid of said second end one of said plurality of laser diode packages.

22. The laser diode array of claim 20, wherein said backplane is made from an electrically insulative material to provide said electrical insulating means, said backplane having a plurality of metallized strips, each of said base surfaces of said heat sinks being soldered to a corresponding one of said plurality of metallized strips.

23. The laser diode array of claim 22, wherein each of said plurality of metallized strips includes a continuous stripe.

24. The laser diode array of claim 22, wherein each of said plurality of metallized strips includes a series of discontinuous pads.

25. The laser diode array of claim 22, wherein said electrically insulative material is a material selected from the group consisting of beryllium oxide, aluminum nitride, boron nitride, and diamond.

26. The laser diode array of claim 20, wherein said backplane is made from an electrically conductive material, said electrical insulating means including an electrically nonconductive bonding material attaching each of said base surfaces of said heat sinks to said backplane.

27. The laser diode array of claim 26, wherein said electrical insulating means further includes a dielectric coating on said backplane.

28. The laser diode array of claim 26, wherein said nonconductive bonding material is a thermally conductive epoxy.

29. The laser diode array of claim 20, wherein each of said heat sinks height is approximately less than two times said diode height.

30. The laser diode array of claim 20, wherein each of said heat sinks includes an exterior surface with a groove thereon adjacent said top surface, each of said grooves extending along the length of said heat sink and for receiving a solder to join said heat sink to a lid of an adjacent one of said plurality of laser diode packages.

31. The laser diode array of claim 30, wherein each of said laser diode bars is attached to said lid and said heat sink with a first solder and said grooves receive a second solder, and wherein a flow temperature of said first solder is greater than a flow temperature of said second solder.

32. The laser diode array of claim 20, wherein each of said heat sinks includes an exterior surface with a series of notches thereon adjacent said top surface, each of said notches extending along the length of said heat sink and for receiving a solder to join said heat sink to a lid of an adjacent one of said plurality of laser diode packages.

33. The laser diode array of claim 32, wherein each of said laser diode bars is attached to said lid and said heat sink with a first solder and said notches receive a second solder, and wherein a flow temperature of said first solder is greater than a flow temperature of said second solder.

34. The laser diode array of claim 30, further including a thermal reservoir attached to said backplane.

35. The laser diode array of claim 34, wherein said thermal reservoir includes an upper surface, said upper surface being said backplane.

36. A laser diode array, comprising:
a plurality of laser diode packages, each of said packages including a laser diode, a heat sink, and a lid, said laser diode having an emitting surface, a reflective surface opposing said emitting surface, and a diode height defined between said emitting surface and said reflective surface, said heat sink having an interior surface, an exterior surface, a top surface, a base surface, and a heat sink height defined between said top surface and said base surface, said lid having an inner surface, an outer surface, an upper end near said emitting surface, and a lower end below said reflecting surface, said laser diode being disposed between and attached to said interior surface of said heat sink and said inner surface of said lid, and wherein said plurality of laser diode packages are arranged in a parallel configuration with each of said plurality of laser diodes packages being in electrical contact with at least one other of said plurality of laser diode packages, said parallel configuration having a heat sink of one of said plurality of laser diode packages contacting a lid of an adjacent one of said plurality of laser diode packages;
means for joining each of said heat sinks with an adjacent one of said lids;
means for supplying electrical power to said plurality of laser diode packages; and
a backplane to which each of said base surfaces of said heat sinks is attached, said backplane including electrical insulating means to prevent an electrical short between adjacent ones of said plurality of laser diode packages.

37. The laser diode array of claim 36, wherein said electrical supplying means includes first and second end caps and said parallel configuration of said plurality of laser diode packages includes a first end one and a second end one of said plurality of laser diode packages, said first end cap being positioned against a heat sink of said first end one of said plurality of laser diodes packages, said second end cap being positioned against a lid of said second end one of plurality of laser diode packages.

38. The laser diode array of claim 36, wherein said backplane is made from an electrically insulative material to provide said electrical insulating means, said backplane having a plurality of metallized strips, each of said base surfaces of said heat sinks being soldered to a corresponding one of said plurality of metallized strips.

39. The laser diode array of claim 38, wherein said electrically insulative material is a material selected from the group consisting of beryllium oxide, aluminum nitride, boron nitride, and diamond.

40. The laser diode array of claim 36, wherein said backplane is made from an electrically conductive material, said electrical insulating means including an electrically nonconductive bonding material attaching each of said base surfaces of said heat sinks to said backplane.

41. The laser diode array of claim 36, wherein said heat sink height is less than approximately four times said diode height.

42. The laser diode array of claim 36, wherein said joining means includes a groove extending on said exterior surface of said heat sink adjacent said top surface, each of said grooves extending along a substantial portion of the length of said heat sink and receiving a solder to attach said heat sink to said adjacent one of said lids.

43. The laser diode array of claim 42, wherein each of said laser diode bars is attached to said lid and said heat sink with a first solder and said grooves receive a second solder, and wherein a flow temperature of said first solder is greater than a flow temperature of said second solder.

44. The laser diode array of claim 42, wherein each of grooves has a groove height, said groove height being approximately less than said diode height.

45. The laser diode array of claim 36, wherein said joining means includes a series of notches extending on said exterior surface of said heat sink adjacent said top surface, said series of notches extending along a substantial portion of the length of said heat sink and receiving a solder to attach said heat sink to said adjacent one of said lids.

46. The laser diode array of claim 45, wherein each of said laser diode bars is attached to said lid and said heat sink with a first solder and said notches receive a second solder, and wherein a flow temperature of said first solder is greater than a flow temperature of said second solder.

47. The laser diode array of claim 45, wherein each of notches has a notch height, said notch height being approximately less than said diode height.

48. The laser diode array of claim 36, further including a thermal reservoir attached to said backplane.

49. The laser diode array of claim 48, wherein said thermal reservoir includes an upper surface, said upper surface being said backplane.

* * * * *